US012633690B2

(12) United States Patent
Hashiguchi

(10) Patent No.: US 12,633,690 B2
(45) Date of Patent: May 19, 2026

(54) BOARD-TO-BOARD CONNECTOR

(71) Applicant: Japan Aviation Electronics Industry, Ltd., Tokyo (JP)

(72) Inventor: Osamu Hashiguchi, Tokyo (JP)

(73) Assignee: Japan Aviation Electronics Industry, Ltd., Tokyo (JP)

( * ) Notice: Subject to any disclaimer, the term of this patent is extended or adjusted under 35 U.S.C. 154(b) by 305 days.

(21) Appl. No.: 18/372,188

(22) Filed: Sep. 25, 2023

(65) Prior Publication Data

US 2024/0145957 A1 May 2, 2024

(30) Foreign Application Priority Data

Oct. 28, 2022 (JP) ................................. 2022-173482

(51) Int. Cl.
*H01R 13/24* (2006.01)
*H01R 12/71* (2011.01)
(Continued)

(52) U.S. Cl.
CPC ........... *H01R 12/716* (2013.01); *H01R 12/73* (2013.01); *H05K 1/141* (2013.01); *H05K 2201/09409* (2013.01)

(58) Field of Classification Search
CPC .... H01R 12/716; H01R 12/73; H01R 12/714; H01R 12/52; H01R 13/02; H01R 12/71;
(Continued)

(56) References Cited

U.S. PATENT DOCUMENTS 6,203,331 B1 3/2001 McHugh et al.
6,276,941 B1 * 8/2001 Wu ...................... H01R 12/714
439/515
(Continued)

FOREIGN PATENT DOCUMENTS

CN 101227034 B 5/2012
JP S57-111970 A 7/1982
(Continued)

OTHER PUBLICATIONS

Office Action for Taiwanese Patent Application No. 112126064, dated Mar. 14, 2024, 10 pages.
(Continued)

*Primary Examiner* — Abdullah A Riyami
*Assistant Examiner* — Nelson R. Burgos-Guntin
(74) *Attorney, Agent, or Firm* — Lippes Mathias LLP

(57) ABSTRACT

A connector according to the present disclosure includes a housing, and a plurality of contacts held in the housing. When a direction in which an input-output board and a CPU board are opposed to each other is called a board opposing direction, each contact includes a holding part, a connecting part, and a spring part. The holding part is extended in a board opposing direction and is held on a housing by press fitting. The spring part includes a contact part, an extended part, and a projection part. The projection part is extended in the board opposing direction and is opposed to the holding part. The connecting part connects an end part of the projection part on the side of the input-output board to an end part of the holding part on the side of the input-output board.

14 Claims, 21 Drawing Sheets

(51) Int. Cl.
    *H01R 12/73*         (2011.01)
    *H05K 1/14*          (2006.01)

(58) Field of Classification Search
    CPC .................. H01R 13/24; H05K 1/141; H05K 2201/09409; H05K 3/3426; H05K 2201/10189; H05K 1/144
    See application file for complete search history.

(56)          References Cited

U.S. PATENT DOCUMENTS

| | | | |
|---|---|---|---|
| 6,293,805 B1 * | 9/2001 | Wu | H01R 12/714 439/66 |
| 6,296,495 B1 * | 10/2001 | Wang | H01R 12/714 439/71 |
| 6,814,587 B2 * | 11/2004 | Ma | H05K 7/1061 439/66 |
| 6,921,270 B2 * | 7/2005 | Mendenhall | H01R 13/2435 439/71 |
| 6,994,566 B2 * | 2/2006 | You | H01R 13/2478 439/862 |
| 11,411,348 B2 * | 8/2022 | Chen | H01R 13/6315 |

| | | | |
|---|---|---|---|
| 2005/0020117 A1 | 1/2005 | Motohashi | |
| 2014/0273641 A1 * | 9/2014 | Light | H01R 12/73 439/625 |
| 2019/0097339 A1 * | 3/2019 | Lim | H01R 12/772 |
| 2019/0150311 A1 * | 5/2019 | Mason | H05K 3/3436 439/55 |
| 2021/0305733 A1 | 9/2021 | Oosaka et al. | |
| 2021/0336366 A1 * | 10/2021 | Oosaka | H01R 13/6215 |
| 2022/0037818 A1 | 2/2022 | Oosaka et al. | |
| 2022/0045445 A1 * | 2/2022 | Oosaka | H05K 3/303 |

FOREIGN PATENT DOCUMENTS

| | | |
|---|---|---|
| JP | S63-150870 A | 6/1988 |
| JP | 2001-230013 A | 8/2001 |
| JP | 2003-031333 A | 1/2003 |
| JP | 2005-044545 A | 2/2005 |
| JP | 6901603 B1 | 7/2021 |

OTHER PUBLICATIONS

Office Action for Japanese Patent Application No. 2022-173482, dated Mar. 10, 2026, 10 pages.

* cited by examiner

Fig. 12

BOARD-TO-BOARD CONNECTOR

INCORPORATION BY REFERENCE

This application is based upon and claims the benefit of priority from Japanese patent application No. 2022-173482, filed on Oct. 28, 2022, the disclosure of which is incorporated herein in its entirety by reference.

BACKGROUND

The present disclosure relates to a board-to-board connector.

As shown in FIG. 21 of the present disclosure, Patent Literature 1 (Japanese Patent No. 6901603) discloses a contact 300 of a connector that is arranged between a first board (input-output board) including a plurality of electrodes and a second board (CPU board) including a plurality of electrodes and electrically connects the plurality of respective electrodes of the first board to the plurality of respective electrodes of the second board.

As shown in FIG. 21, each contact 300 includes a press-fit part 320, a soldering part 321, and an electrical contact spring piece 322.

SUMMARY

In the structure disclosed in Patent Literature 1, the electrical contact spring piece 322 is a part that functions as an electrical contact point with a corresponding pad of the CPU board. The electrical contact spring piece 322 is extended from a lower end of a spring piece joining part 325 and is formed in a U-shape that is convex in the width direction. A contact part 327 is a part that can come into electrical contact with the corresponding pad of the CPU board. The contact part 327 is placed at an end of an upper straight part 326C of an elastically deformable part 326 and is formed to curve to be convex upward.

In the board-to-board connector including the aforementioned connector, from the point of view of reliability of the electrical connection between the contact and the pad, there is a room to consider a spring length of a spring part including the contact part, in other words, the length of the spring part that can be elastically deformed.

An object of the present disclosure is to provide a technique for ensuring the spring length of the spring part of the contact.

According to a first aspect of the present disclosure, a board-to-board connector that is interposed between a first board and a second board, the board-to-board connector thus electrically connecting a plurality of pads of the first board to a plurality of respective pads of the second board, the board-to-board connector including: a housing; and a plurality of contacts held on the housing, in which when a direction in which the first board and the second board are opposed to each other is called a board opposing direction, each of the contacts includes a holding part, a connecting part, and a spring part, the holding part is extended in the board opposing direction and is held on the housing by press fitting, the spring part includes a contact part, an extended part, and a projection part, the projection part is extended in the board opposing direction and is opposed to the holding part, the connecting part connects an end part of the projection part on the side of the first board and an end part of the holding part on the side of the first board, the extended part is extended from an end part of the projection part on the side of the second board in such a way that the extended part passes between the holding part and the second board, and the contact part is disposed in the extended part in such a way that the contact part comes into contact with a corresponding pad of the second board.

According to the present disclosure, a spring length of a spring part can be secured.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF DRAWINGS

FIG. 12 is a side view of the board-to-board connector that electrically connects the first board to the second board (second embodiment);

DESCRIPTION OF EMBODIMENTS

Hereinafter, with reference to the drawings, specific embodiments to which the present disclosure is applied will be described in detail. However, the present disclosure is not limited to the following embodiments. Further, for the sake of clarification of the description, the following descriptions and drawings are simplified as appropriate.

As a matter of course, the right-handed XYZ coordinates shown in FIG. 1 and other drawings are shown for convenience of describing the positional relationship of the components, and do not suggest any posture when a connector and the like that will be described below are actually used. Usually, an X-axis direction is a width direction, a Y-axis direction is a pitch direction, a Z-axis direction is a board opposing direction in which an input-output board 10 and a CPU board 20 that will be described later are opposed to each other, and an XY plane is a horizontal plane, which is common among the drawings.

First Embodiment

In the following, with reference from FIG. 1 to FIG. 6, a first embodiment of the present disclosure will be described.

Figure 1:
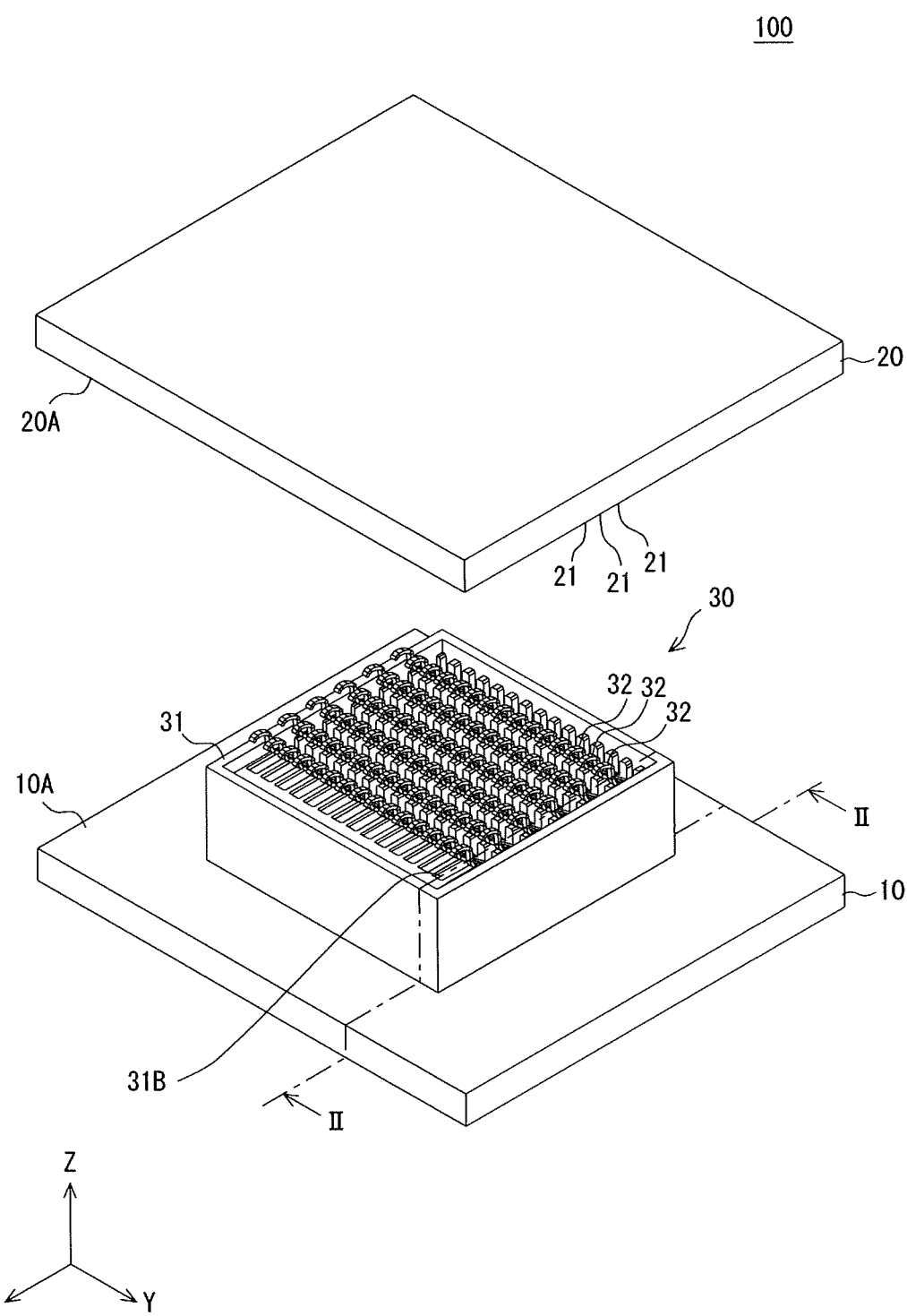
FIG. 1 is a perspective view of an information processing device in which an electrical connection with a first board is released (first embodiment)

As shown in FIG. 1, an information processing device 100 includes an input-output board 10 (a first board), a CPU board 20 (a second board), and a connector 30 (a board-to-board connector). The connector 30 is disposed between the input-output board 10 and the CPU board 20.

The input-output board 10 and the CPU board 20 are, for example, CPU boards or input-output boards. The CPU board and the input-output board are rigid boards such as paper phenolic boards or glass epoxy boards, for example.

Figure 2:
FIG. 2 is a cross-sectional view taken along the line II-II of FIG. 1 (first embodiment)
Figure 2:
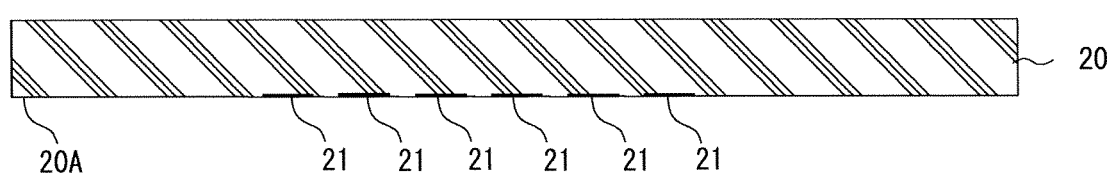
Figure 2:
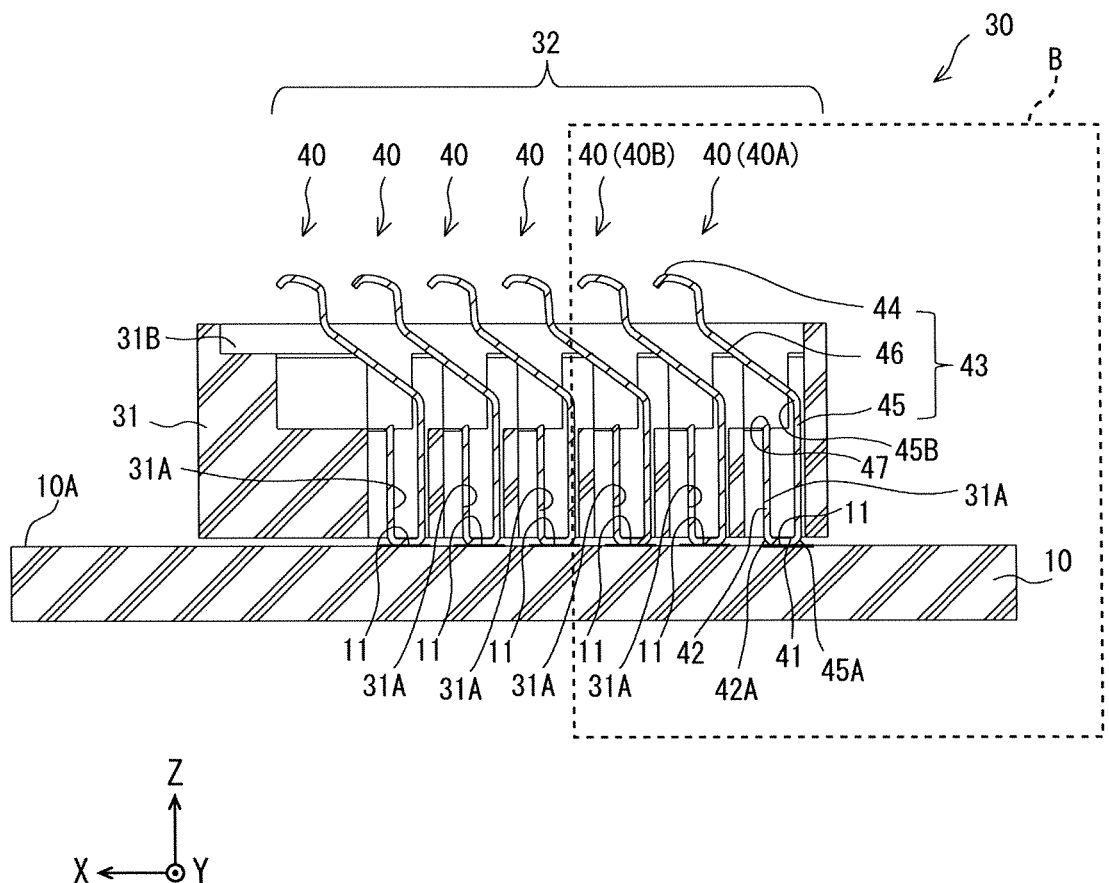

The input-output board 10 includes an opposed surface 10A opposed to the CPU board 20. As shown in FIG. 2, a plurality of pads 11 are disposed on the opposed surface 10A. In this embodiment, the plurality of pads 11 are disposed in a matrix of 15 rows and 6 columns on the opposed surface 10A. Further, as shown in FIG. 2, six pads 11 are lined up in the width direction (in this example, X-axis direction).

The CPU board 20 includes an opposed surface 20A opposed to the input-output board 10. A plurality of pads 21 are disposed on the opposed surface 20A. In this embodiment, the plurality of pads 21 are disposed in a matrix of 15 rows and 6 columns on the opposed surface 20A. The column direction corresponds to the X-axis direction and the row direction corresponds to the Y-axis direction. Further, in the cross section shown in FIG. 2, six pads 21 are lined up in the width direction.

The connector 30 includes a housing 31 and a plurality of contact rows 32.

The housing 31 includes a plurality of contact holding grooves 31A and a plurality of extended part accommodation spaces 31B. The housing 31 is a rectangular flat-plate housing made of insulating resin. The plurality of contact holding grooves 31A may be disposed in the housing 31 so as to correspond to the plurality of respective pads 11 and the plurality of respective pads 21. Each extended part accommodation space 31B may be disposed in one end of each contact row 32. Further, in this embodiment, six contact holding grooves 31A are lined up in the width direction.

Each extended part accommodation space 31B is disposed in one end of each contact row 32 formed of six contact holding grooves 31A.

The plurality of contact rows 32 are held on the housing 31. The plurality of contact rows 32 extend parallel to one another. In this embodiment, the number of contact rows 32 is 15. Each contact row 32 includes a plurality of contacts 40 made of metal. Each contact 40 is formed, for example, by blanking (i.e., punching) and bending copper or copper alloy.

Figure 3:
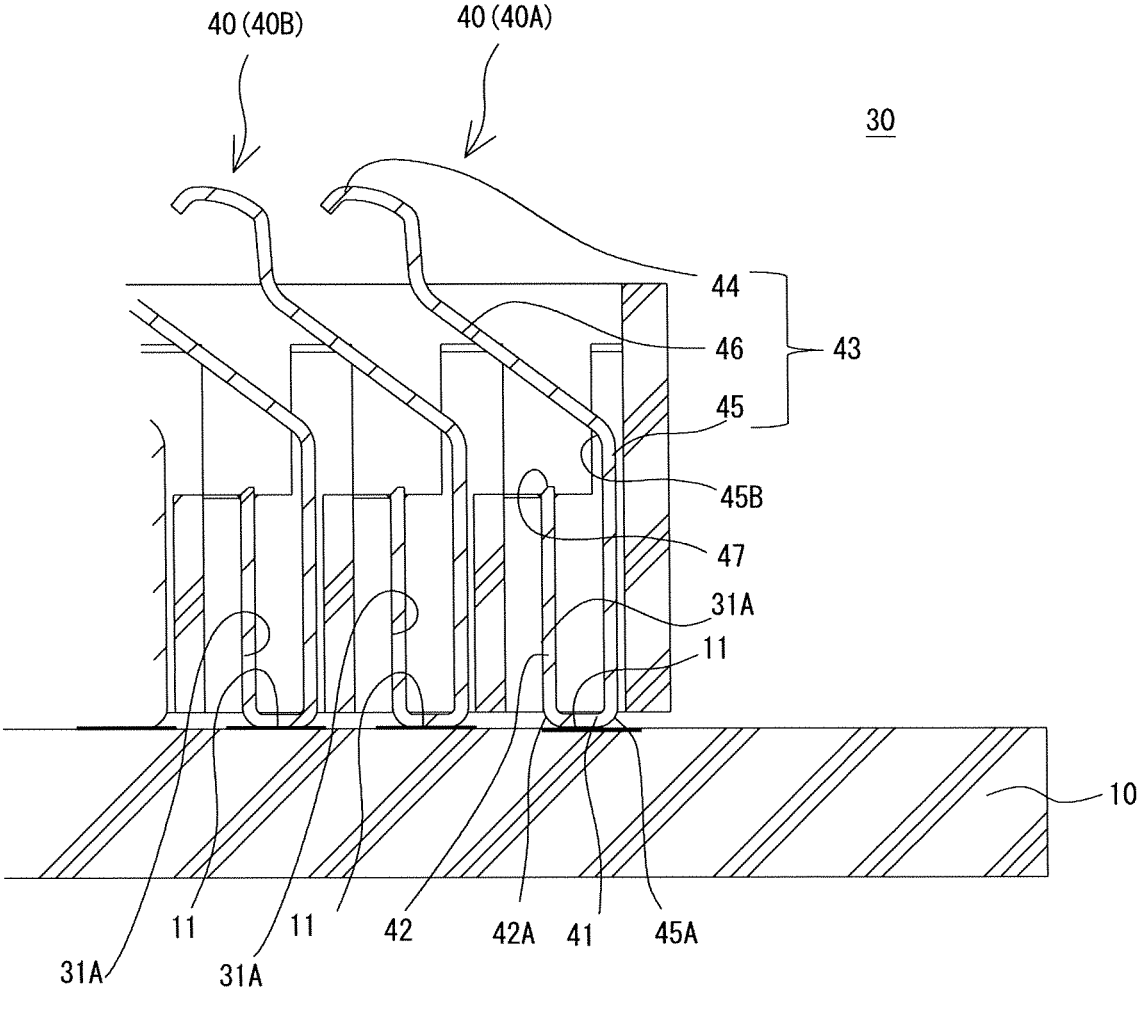
FIG. 3 is an enlarged view of a B part of FIG. 2 (first embodiment)
Figure 3:
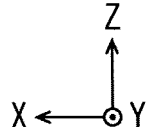

As shown in FIGS. 2 and 3, each contact 40 includes a holding part 42, a connecting part 41, and a spring part 43. Each contact 40 is a plate-like body in which the holding part 42, the connecting part 41, and the spring part 43 are continuous in this recited order.

The direction in which the input-output board 10 and the CPU board 20 are opposed to each other is called a board opposing direction (in this example, Z-axis direction).

The holding part 42 is extended in the board opposing direction and is held in the contact holding groove 31A of the housing 31 by press fitting. The holding part 42 includes an end part 42A on the side of the input-output board 10 (in this example, negative Z-axis direction).

The spring part 43 includes a contact part 44, an extended part 46, and a projection part 45. The projection part 45 is extended in the board opposing direction and is opposed to the holding part 42. The projection part 45 includes an end part 45A on the side of the input-output board 10 and an end part 45B on the side of the CPU board 20 (in this example, positive Z-axis direction). The projection part 45 and the holding part 42 may overlap each other in the directions opposed to each other (in this example, X-axis direction). Accordingly, the distance between contact rows 32 that are adjacent to each other (in this example, Y-axis direction), that is, the pitches between the plurality of contacts 40 can be reduced.

The spring part 43 is a plate-like body that can be elastically deformed, and has, for example, a function that is the same as that of a leaf spring. When, for example, the contact part 44 is pressed toward the input-output board 10, the spring part 43 is warped in such a way that the projection part 45 and the extended part 46 are inclined toward the holding part 42 (in this example, X-axis positive direction) around the end part 45A.

The connecting part 41 mechanically connects the end part 45A of the projection part 45 on the side of the input-output board 10 to the end part 42A of the holding part 42 on the side of the input-output board 10. Further, the connecting part 41 may be electrically connected to the pad 11 by, for example, soldering. The extended part 46 is extended from the end part 45B of the projection part 45 on the side of the CPU board 20 in such a way that the extended part 46 passes between the holding part 42 and the CPU board 20. The extended part 46 is opposed to the holding part 42 in the board opposing direction (in this example, Z-axis direction). The contact part 44 is formed in the extended part 46 in such a way that the contact part 44 comes into contact with the corresponding pad 21 of the CPU board 20. The contact part 44 may be disposed at the distal end of the extended part 46 or in a vicinity thereof.

Further, in this embodiment, the plurality of contacts 40 include a first contact 40A and a second contact 40B that are adjacent to each other. The extended part 46 of the spring part 43 of the first contact 40A is opposed to the extended part 46 of the spring part 43 of the second contact 40B in the board opposing direction. It is thus possible to reduce the distance between the first contact 40A and the second contact 40B that are adjacent to each other (in this example, X-axis direction), and thereby gaps between the contact rows 32 can be reduced.

<Connection Method>

Next, a method for electrically connecting the input-output board 10 and the CPU board 20 using the connector 30 will be described.

Figure 4:
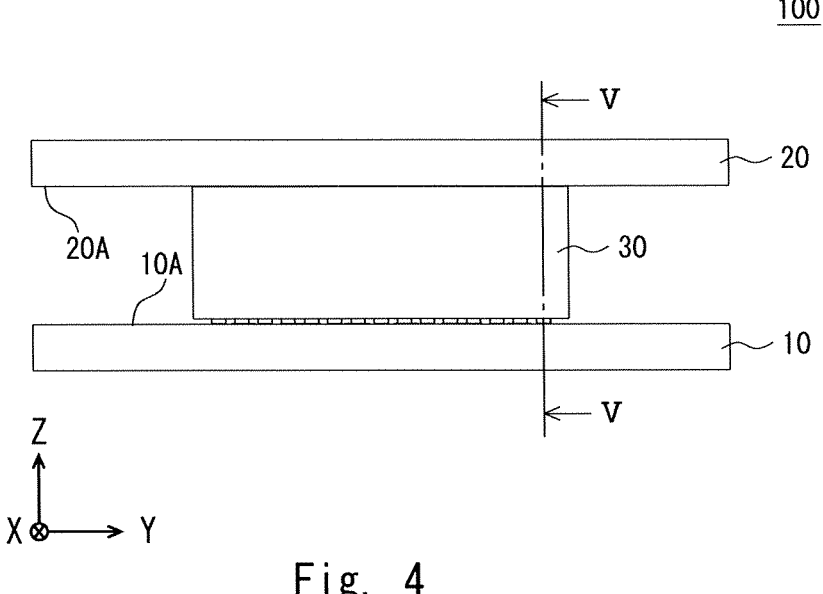
FIG. 4 is a side view of a board-to-board connector that electrically connects a first board to a second board (first embodiment)
Figure 5:
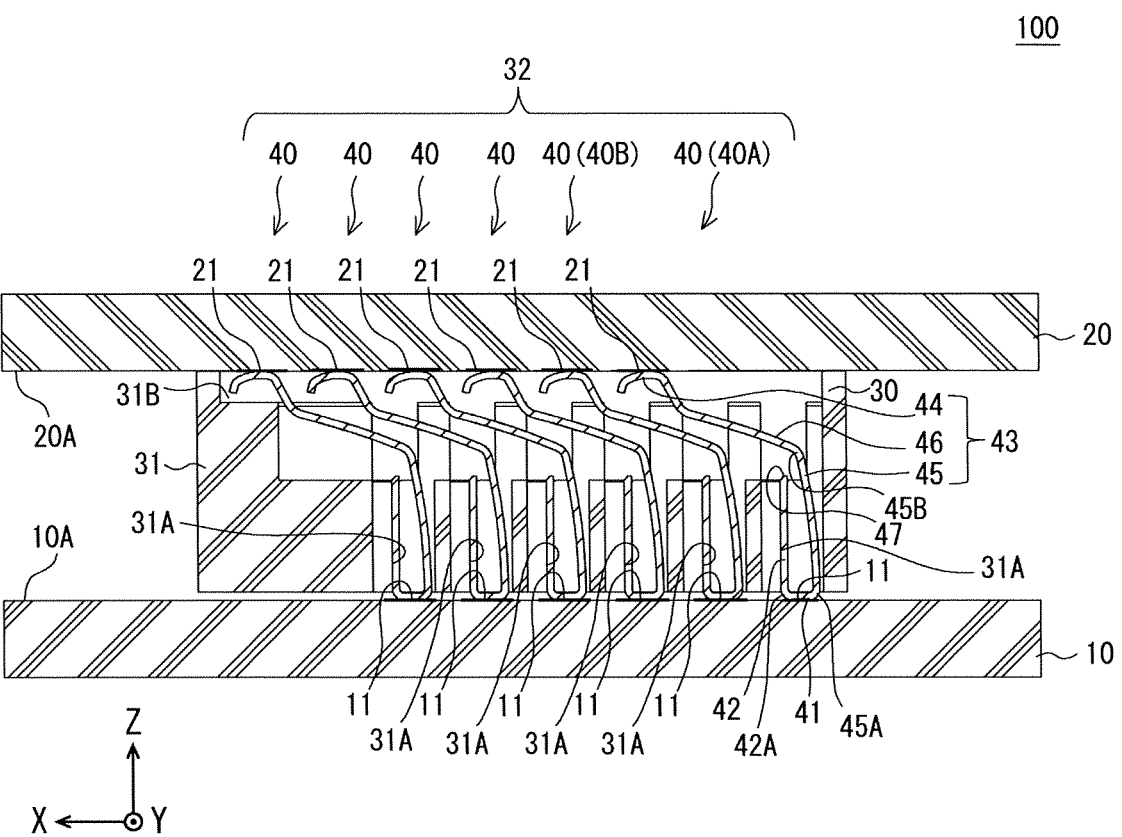
FIG. 5 is a cross-sectional view taken along the line V-V of FIG. 4 (first embodiment)

FIG. 4 shows a side view of the connector 30 that electrically connects the input-output board 10 to the CPU board 20. FIG. 5 shows a cross-sectional view of the connector 30 shown in FIG. 4. As shown FIGS. 4 and 5, the CPU board 20 is pressed against the connector 30 while keeping a state in which the opposed surface 20A of the CPU board 20 and the opposed surface 10A of the input-output board 10 are opposed to each other. The CPU board 20 is pressed against the connector 30 in such a way that the plurality of pads 21 come into contact with the contact parts 44 of the plurality of respective contacts 40.

Then, the pad 21 presses back the contact part 44 toward the input-output board 10. When the contact part 44 is pressed toward the input-output board 10, the spring part 43 is warped, and is inclined toward the holding part 42 around the end part 45A.

The spring part 43 is elastically deformed, and the contact part 44 applies a pressing force in the direction the CPU board 20 to the pad 21 that is in contact with the contact part 44. Since the contact part 44 and the pad 21 press against each other, the contact part 44 and the pad 21 are electrically connected.

The amount of elastic deformation of the spring part 43 can be made larger as the spring length of the spring part 43, that is, the part that can be elastically deformed is increased. The spring part 43 is a plate-like body that can be elastically deformed. Further, the projection part 45 of the spring part 43 is extended in the board opposing direction, and the extended part 46 is extended from the end part 45B of the projection part 45 on the side of the CPU board 20 in such a way that the extended part 46 passes between the holding part 42 and the CPU board 20. Therefore, the spring length of the spring part 43 can be secured. Accordingly, it is possible to secure the amount of elastic deformation of the spring part 43 and the amount of force with which the contact part 44 and the pad 21 press against each other and to improve the reliability of the electrical connection between the contact part 44 and the pad 21.

From the above discussion, the connector 30 is interposed between the input-output board 10 and the CPU board 20, and thereby the plurality of pads 11 of the input-output board 10 and the plurality of respective pads 21 of the CPU board 20 are electrically connected to each other.

<Method for Manufacturing Contacts>

Next, an example of a method for manufacturing the plurality of contacts will be described.

Figure 6:
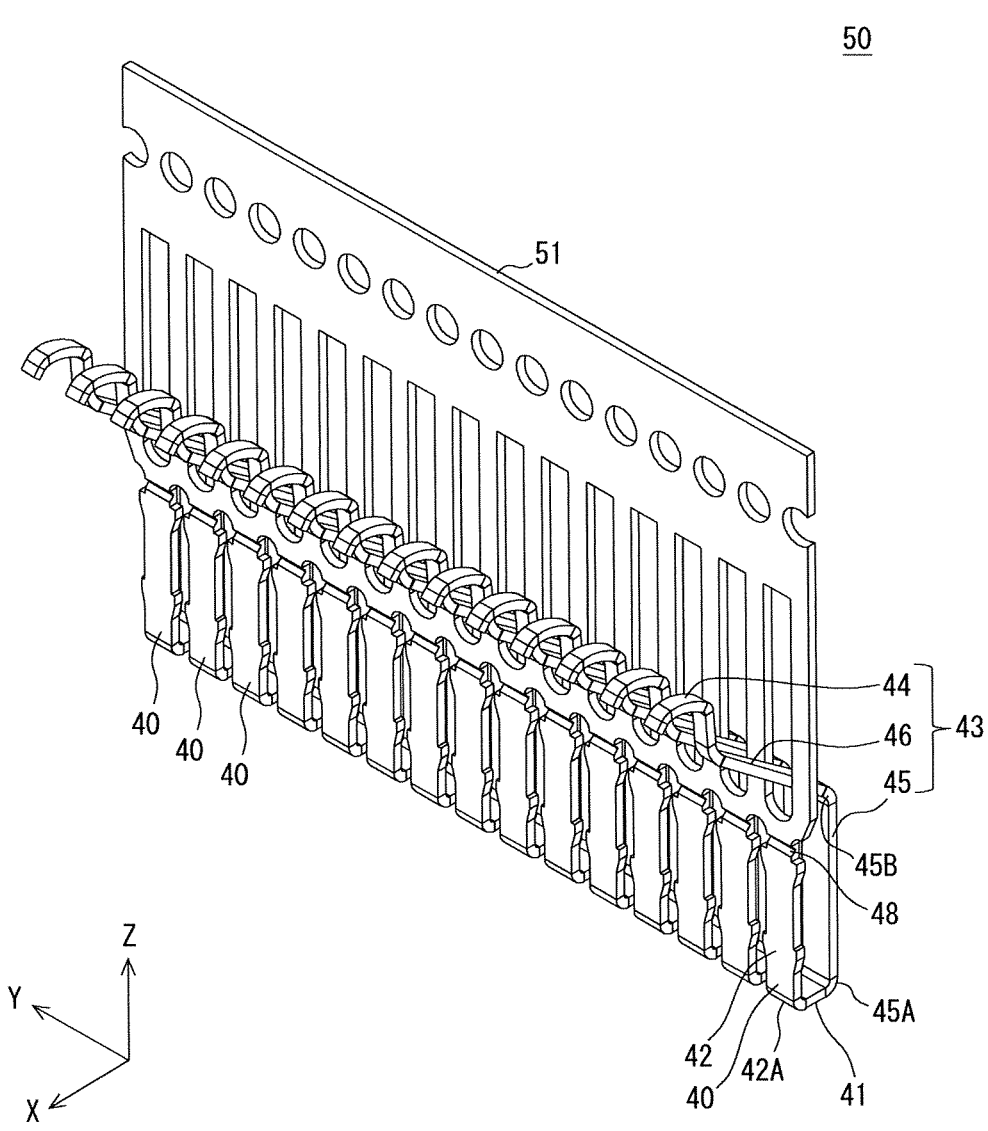
FIG. 6 is a perspective view of a contact with carrier (first embodiment)

A hoop material made of copper or copper alloy is blanked (i.e., punched) to form a blanked body (i.e., punched body). Further, the blanked body is bent to form a contact with carrier. FIG. 6 is a perspective view of the contact with carrier. As shown in FIG. 6, a contact 50 with carrier includes a carrier 51 and a plurality of contacts 40. In this embodiment, the plurality of contacts 40 are 15 contacts 40. In the contact 50 with carrier, the respective contacts 40 are mechanically connected to the carrier 51 via respective cutting parts 48. Here, each contact 40 is a plate-like body in which the holding part 42, the connecting part 41, and the spring part 43 are continuous in this recited order, and an end surface of this plate-like body is a blanked-out surface (i.e., punched-out surface).

Next, the contact 50 with carrier is plated as necessary.

Lastly, by cutting the cutting parts 48, the plurality of contacts 40 and the carrier 51 are separated from each other. Each of these separated contacts 40 has a carrier cutting surface 47 shown in FIGS. 2, 3, and 5. The carrier cutting surface 47 is formed by the cutting parts 48 being cut. The carrier cutting surface 47 is formed in an end part of the holding part 42 on the side of the CPU board 20. The holding part 42 of each contact 40 includes the carrier cutting surface 47. In the connector 30, the carrier cutting surface 47 faces toward the CPU board 20. The carrier cutting surface 47 is observable from the side of the CPU board 20. Specifically, the carrier cutting surface 47 is observable from the front side of the carrier cutting surface 47 (in this example, the positive Z-axis direction) or from an oblique direction of the carrier cutting surface 47 on the side of the CPU board from the carrier cutting surface 47. The oblique direction of the carrier cutting surface 47 is, for example, a direction that is along a virtual line that crosses the normal line of the carrier cutting surface 47. When the contact 50 with carrier is plated, each contact 40 is plated with the exception of carrier cutting surface 47. Here, an end surface of the plate-like body in which the holding part 42, the connecting part 41, and the spring part 43 of each contact 40 are continuous in this recited order is a blanked-out surface (i.e., punched-out surface) with the exception of the carrier cutting surface 47. The surface roughness of the carrier cutting surface 47 is higher than the surface roughness of the blanked-out surface. The developed shape of the contact 40 is a shape of the part that corresponds to the contact 40 in the blanked body before the contact with carrier is formed. The carrier cutting surface 47 faces in a direction that is opposite to the direction in which the extended part 46 is extended from the end part 45B of the projection part 45 on the side of the CPU board 20 in the developed shape of the contact 40.

The contact 50 with carrier is pressed from the side of the CPU board 20 of the housing 31, and the holding parts 42 of the respective contacts 40 of the contact 50 with carrier are press-fit into the respective contact holding grooves 31A. Then, the carrier 51 may be swung around the cutting parts 48, thereby cutting the cutting parts 48. Further, the cutting parts 48 may be cut while performing this press fitting. This allows the housing 31 to easily hold the plurality of contact rows 32.

Second Embodiment

Next, with reference to FIGS. 7 to 13, a second embodiment will be described. Hereinafter, differences of this embodiment from the above-described first embodiment will be mainly described, and redundant description will be omitted.

Figure 7:
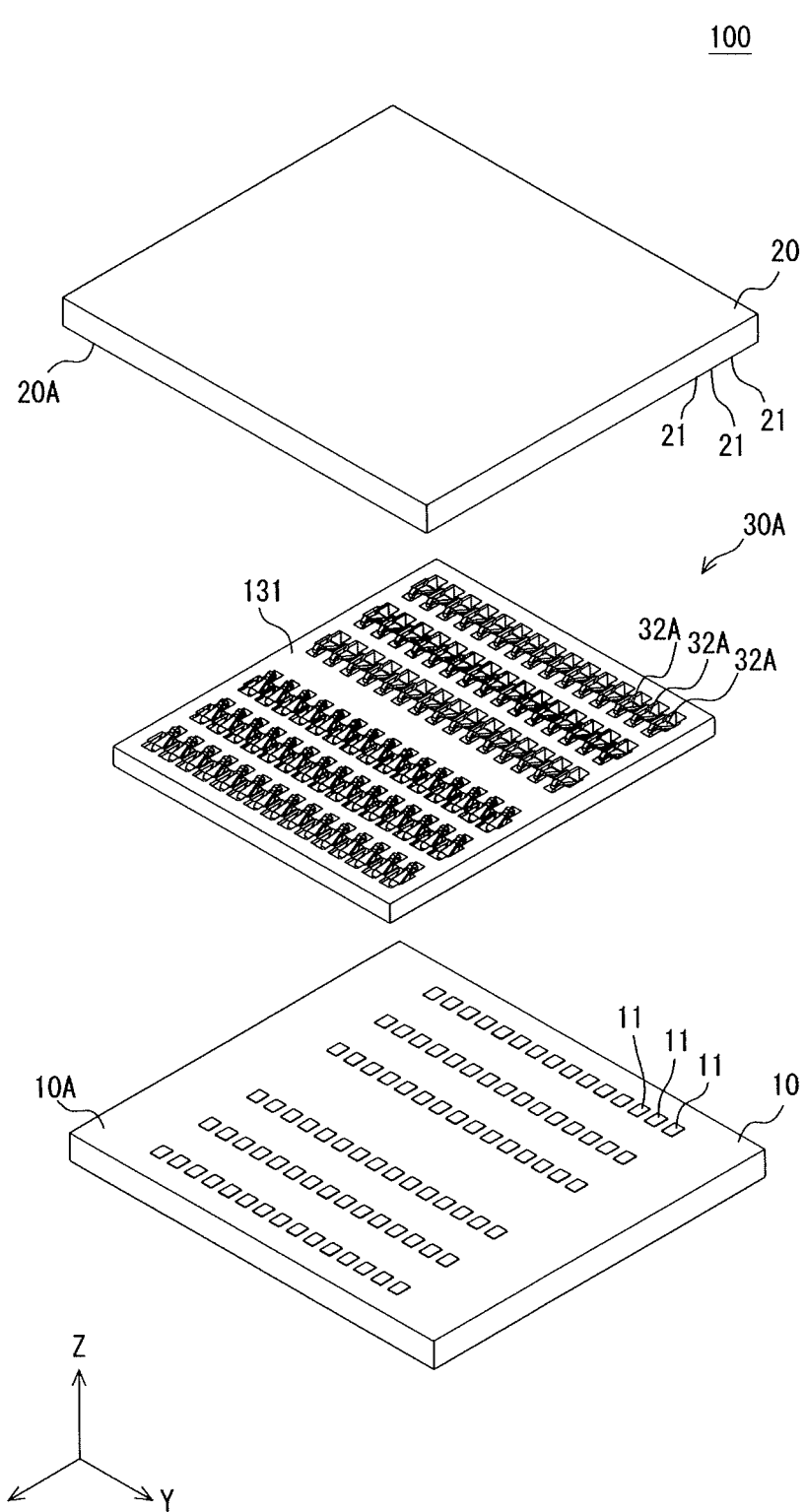
FIG. 7 is an exploded perspective view of a first board, a board-to-board connector, and a second board (second embodiment)
Figure 8:
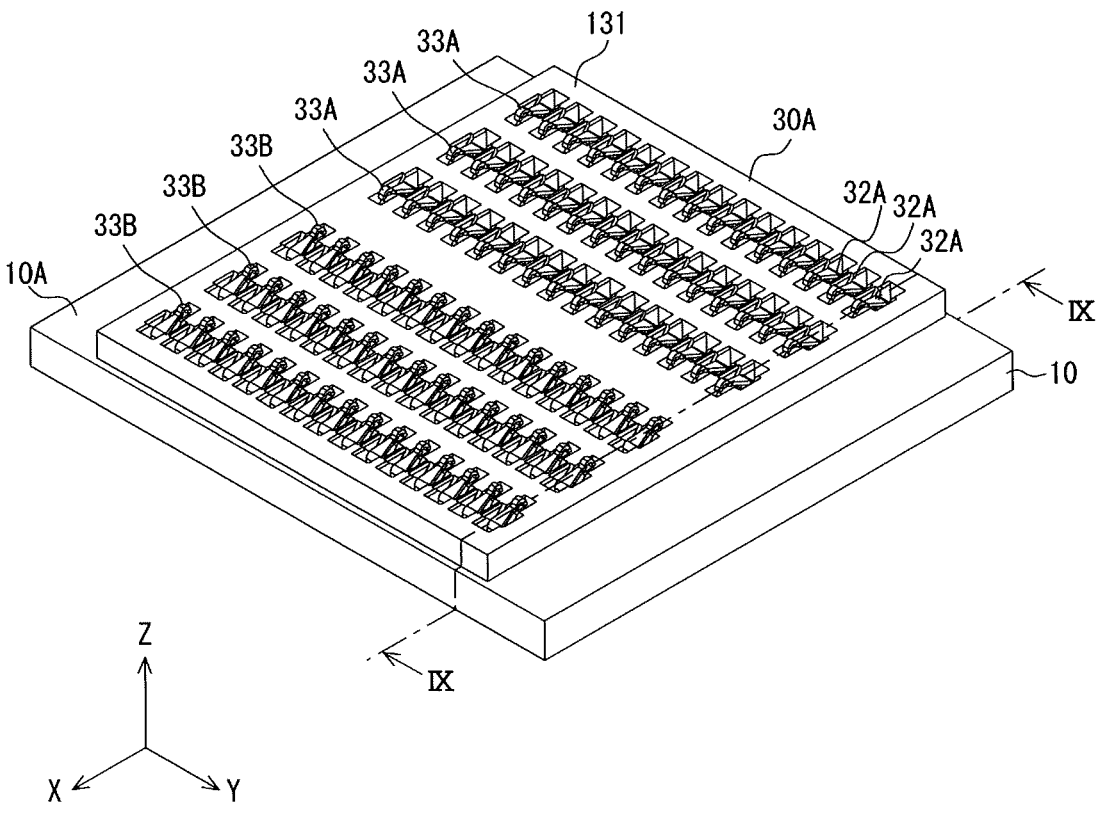
FIG. 8 is a perspective view of the board-to-board connector mounted on the first board (second embodiment)

As shown in FIGS. 7 and 8, a connector 30A (board-to-board connector) includes a housing 131 and a plurality of contact rows 32A.

Figure 9:
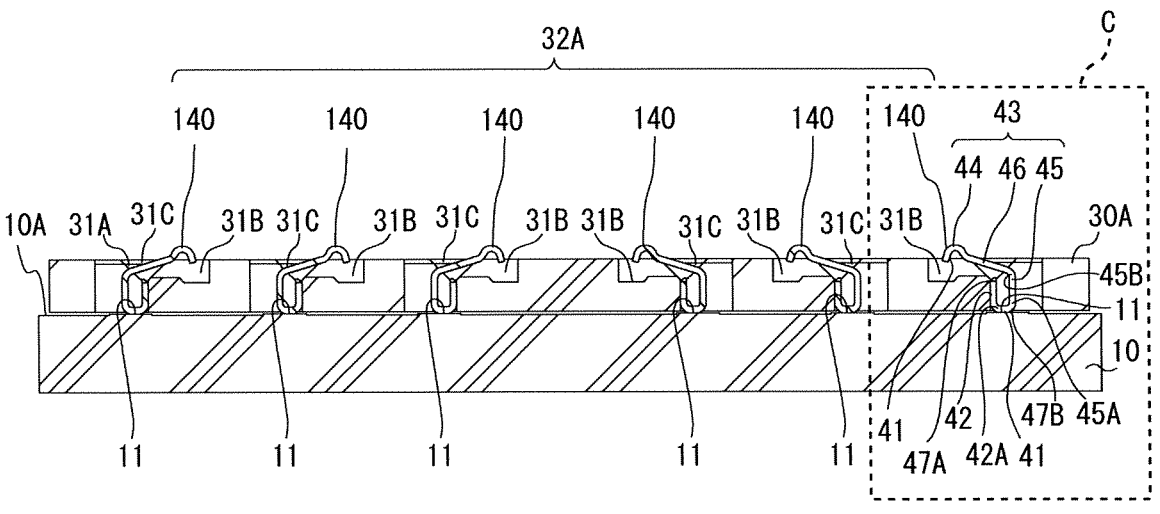
FIG. 9 is a cross-sectional view taken along the line IX-IX of FIG. 8 (second embodiment)
Figure 9:
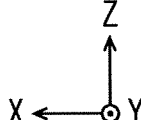

The housing 131 includes a plurality of contact holding grooves 31A and a plurality of extended part accommodation spaces 31B. The housing 131 is a rectangular flat-plate housing made of insulating resin. The plurality of contact holding grooves 31A may be disposed in the housing 31 in such a way that the plurality of contact holding grooves 31A correspond to a plurality of respective pads 11 and a plurality of respective pads 21. As shown in FIG. 9, each of the extended part accommodation spaces 31B may be disposed in one end of each contact 140. Further, in this embodiment, six contact holding grooves 31A are lined up in the width direction (in this example, X-axis direction). Each of the extended part accommodation spaces 31B is disposed in one end of each of the contact holding grooves 31A.

The plurality of contact rows 32A are held on the housing 131. The plurality of contact rows 32A are extended to be parallel to one another. Further, the plurality of contact rows 32A are disposed in a matrix. A plurality of contact rows 33A and 33B aligned in a direction (in this example, Y-axis direction) perpendicular to the direction in which the plurality of contact rows 32A are extended (in this example, X-axis direction) are formed. In this embodiment, the plurality of contact rows 32A include 15 contact rows 32A. The number of contact rows 33A is 3. The number of contact rows 33B is 3. The plurality of contact rows 32A include a plurality of contacts 140 made of metal.

While each of the contacts 140 has a structure similar to that of the contact shown in FIG. 2, each of the contacts 140 may be resize as appropriate depending on the specification of the product. In each contact row 32A, the projection part 45 and the extended part 46 of each of the contacts 140 are inclined toward the center of the contact row 32A. In other words, the projection parts 45 and the extended parts 46 are inclined in such a way that the projection parts 45 and the extended part 46 of each of the contacts 140 in the plurality of contact rows 33A and the projection part 45 and the extended part 46 of each of the contacts 140 in the plurality of contact rows 33B are opposed to each other.

Figure 10:
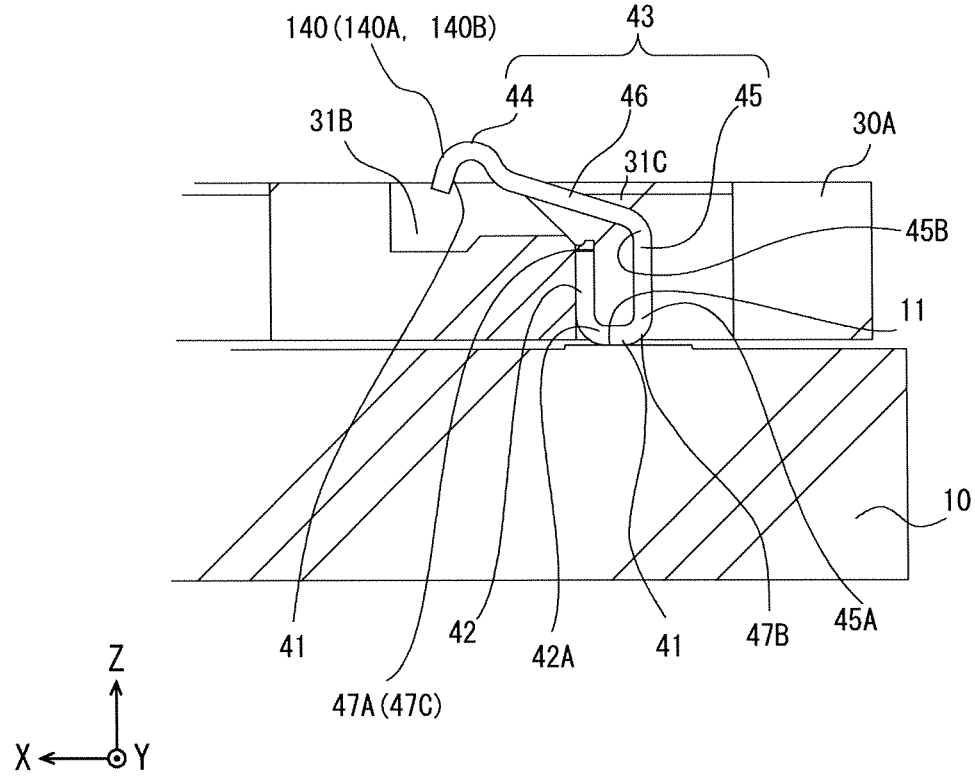
FIG. 10 is an enlarged view of a part C of FIG. 9 (first embodiment)
Figure 11:
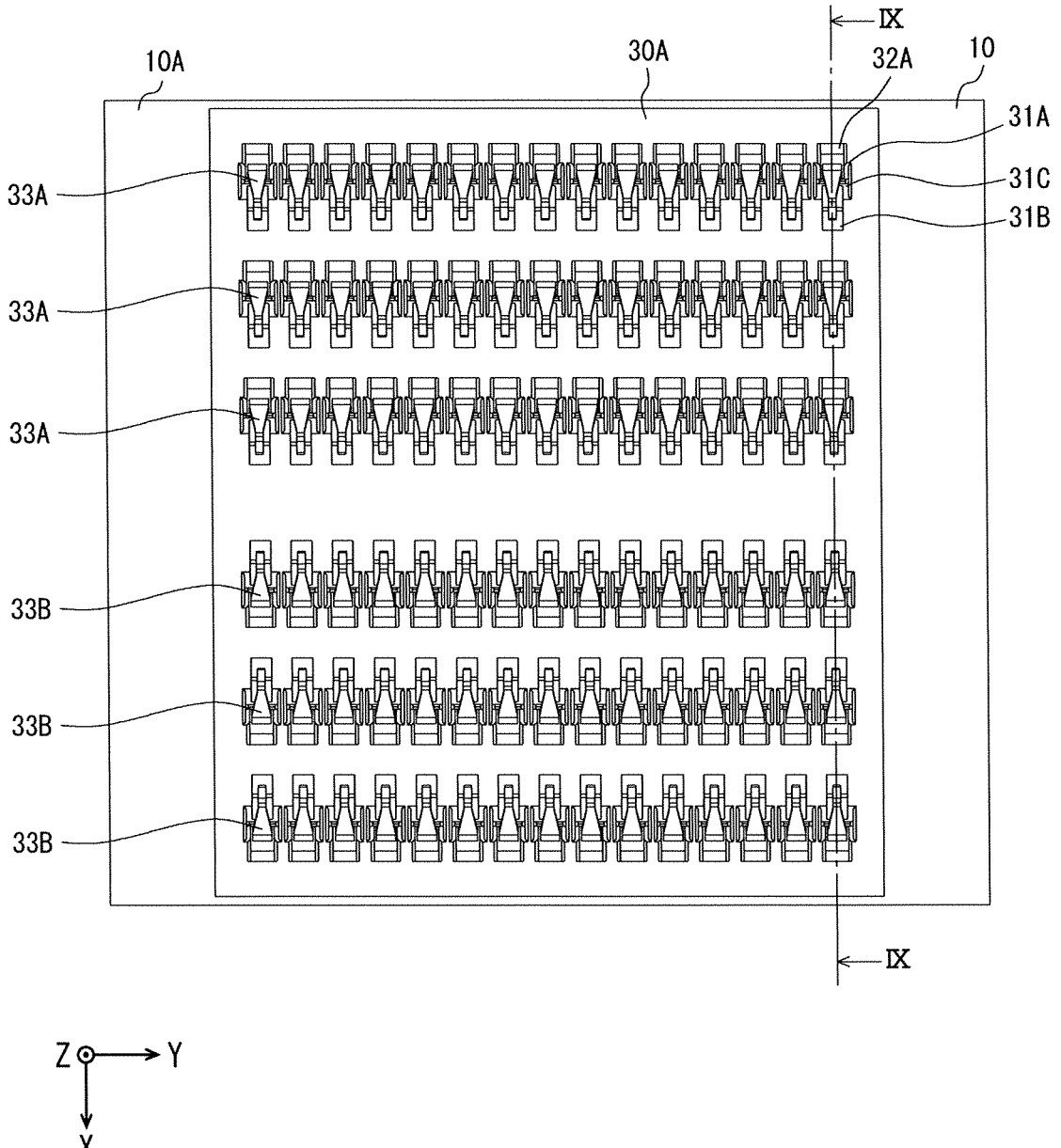
FIG. 11 is a plan view of the board-to-board connector mounted on the first board (second embodiment)

As shown in FIGS. 9 to 11, each of the contact holding grooves 31A includes a concave part 31C. The concave part 31C is opened on a surface of the housing 131 on the side of the CPU board 20. In the cross sections shown in FIGS. 9 and 10, the concave part 31C is extended in an approximate V shape toward the CPU board 20 from an end part of the holding part 42 on the side of the CPU board 20, that is, from a carrier cutting surface 47A that will be described later.

Figure 12:
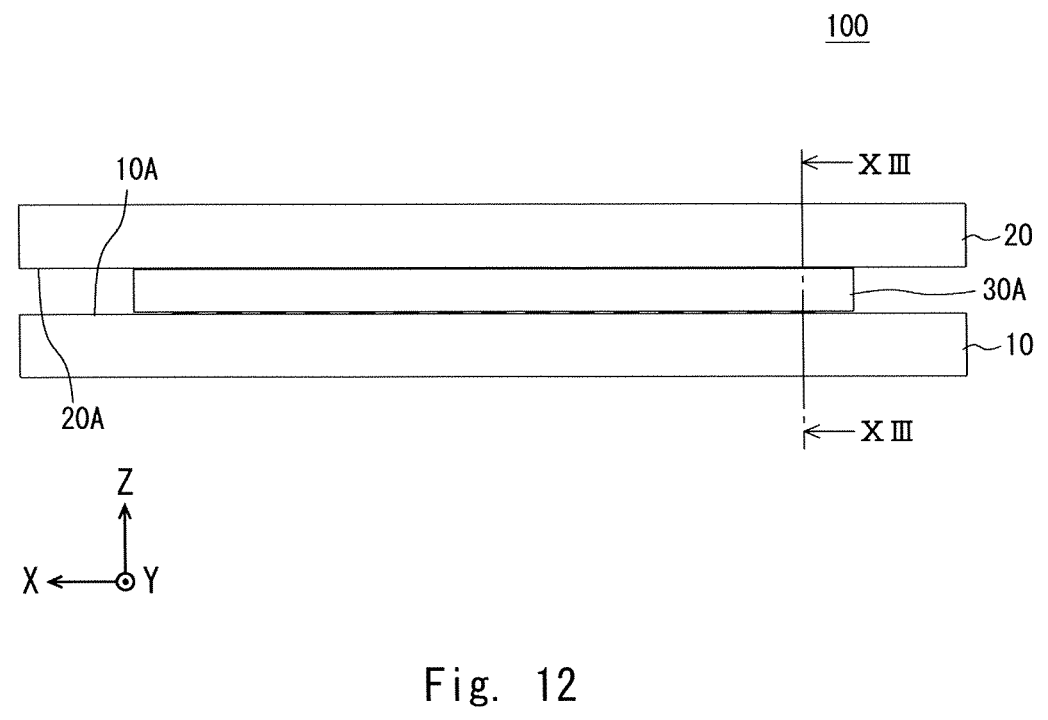
Figure 13:
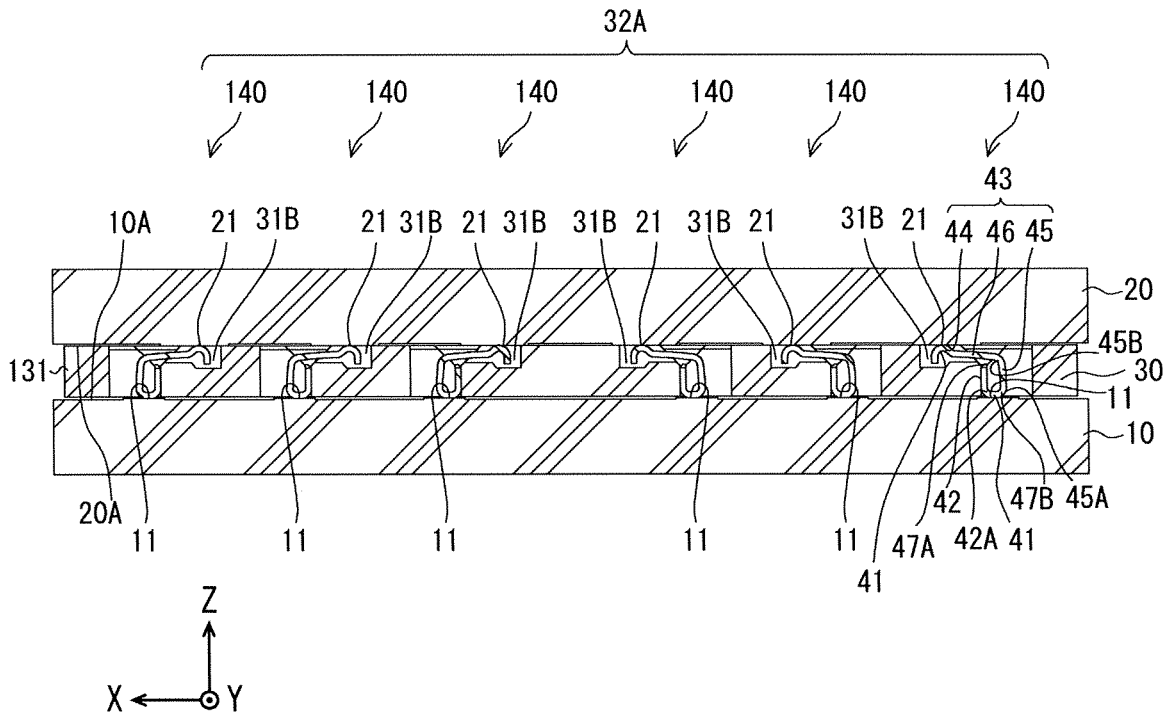
FIG. 13 is a cross-sectional view taken along the line XIII-XIII of FIG. 12 (second embodiment)

As shown in FIGS. 12 and 13, the input-output board 10 and the CPU board may be electrically connected to each other using the connector 30A, like the connector 30.

<Method for Manufacturing Contacts>

Next, one example of a method for manufacturing the plurality of contacts 140 will be described. Differences from the above-described example of the method for manufacturing the plurality of contacts 40 will be mainly described, and redundant description will be omitted.

Figure 14:
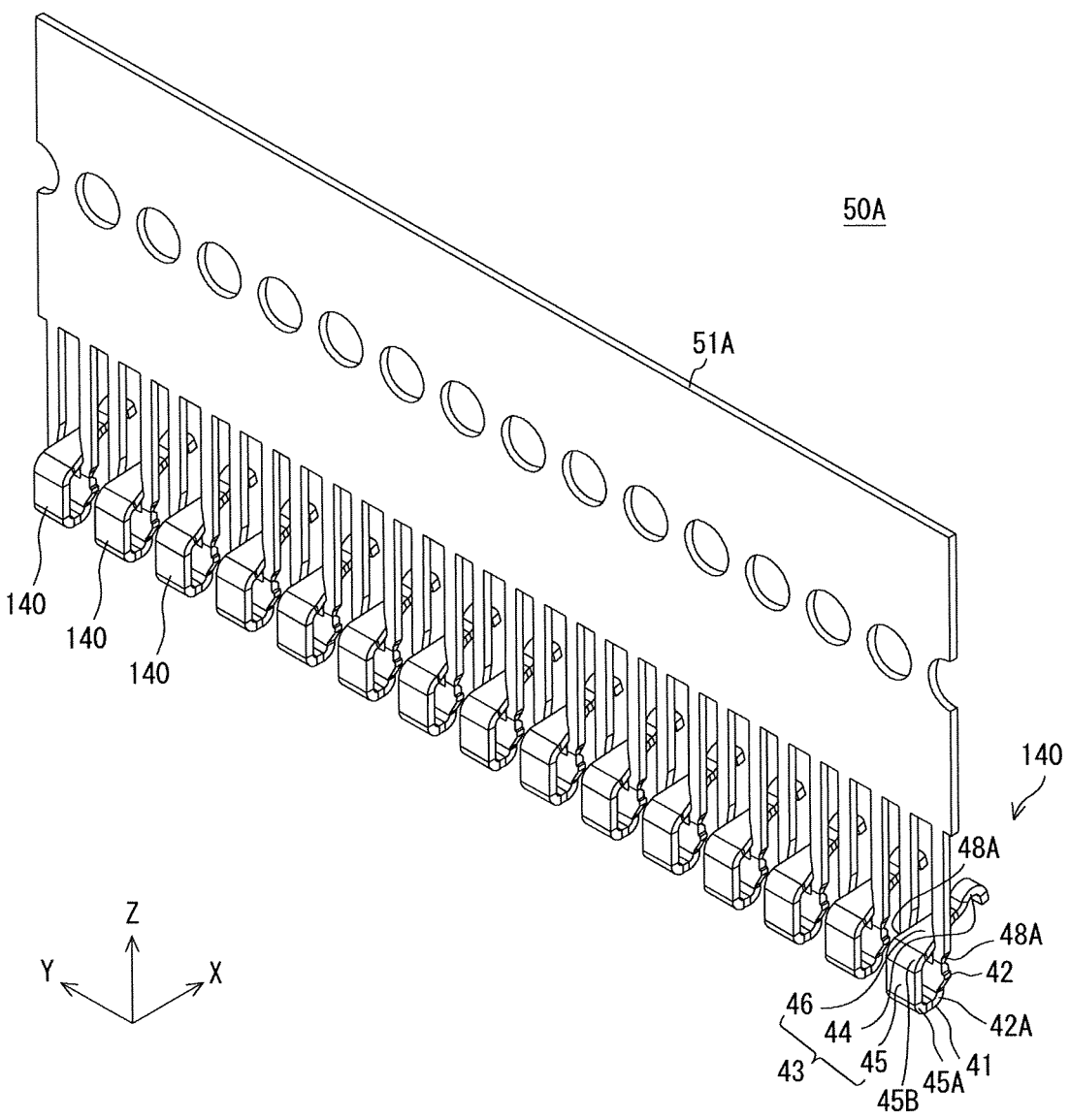
FIG. 14 is a perspective view of a contact with carrier (second embodiment)

As shown in FIG. 14, a contact 50A with carrier includes a carrier 51A and a plurality of contacts 140. In this embodiment, the plurality of contacts 140 are contacts 140. Each of the contacts 40 is mechanically connected to the carrier 51A via two cutting parts 48A. By cutting each of the two cutting parts 48A, each of the contacts 140 is separated from the carrier 51A. Each of these separated contacts 140 includes two carrier cutting surfaces 47A. The two carrier cutting surfaces 47A are formed by the two cutting parts 48A being cut. The carrier cutting surface 47A shown in FIG. 10 is formed in an end part of the holding part 42 on the side of the CPU board 20. That is, the holding part 42 of each of the contacts 140 includes two carrier cutting surfaces 47A. The two carrier cutting surfaces 47A are disposed in the pitch direction (in this example, Y-axis direction) with gaps therebetween in an end part of the holding part 42 on the side of the CPU board 20. The carrier cutting surfaces 47A face toward the CPU board 20. The carrier cutting surfaces 47A is observable from the CPU board 20. Specifically, the carrier cutting surfaces 47A is observable from the front of the carrier cutting surface 47A (in this example, positive Z-axis direction) or from an oblique direction of the carrier cutting surface 47A on the side of the CPU board from the carrier cutting surface 47A. The oblique direction of the carrier cutting surfaces 47A is, for example, a direction along a virtual line that crosses the normal line of the carrier cutting surface 47A.

Note that the contact 50A with carrier may be pressed from the side of the CPU board 20 of the housing 131 shown in FIG. 7, the holding parts 42 of the respective contacts 140 of the contact 50A with carrier may be press-fit into the respective contact holding grooves 31A, and the cutting parts 48A may be cut. Further, the cutting parts 48A may be cut while performing this press fitting. The carrier 51A may be swung around the cutting parts 48A, thereby cutting the cutting parts 48A. The concave parts 31C shown in FIGS. 9-11 may each have a space that is large enough for the carrier 51A to be swung around the cutting parts 48A with a great amplitude when contacts 140 of the contact 50A with carrier shown in FIG. 14 are separated from the carrier 51A. Accordingly, the carrier 51A can be swung easily around the cutting parts 48A. This allows the housing 131 to easily hold the plurality of contact rows 32.

Third Embodiment

Figure 15:
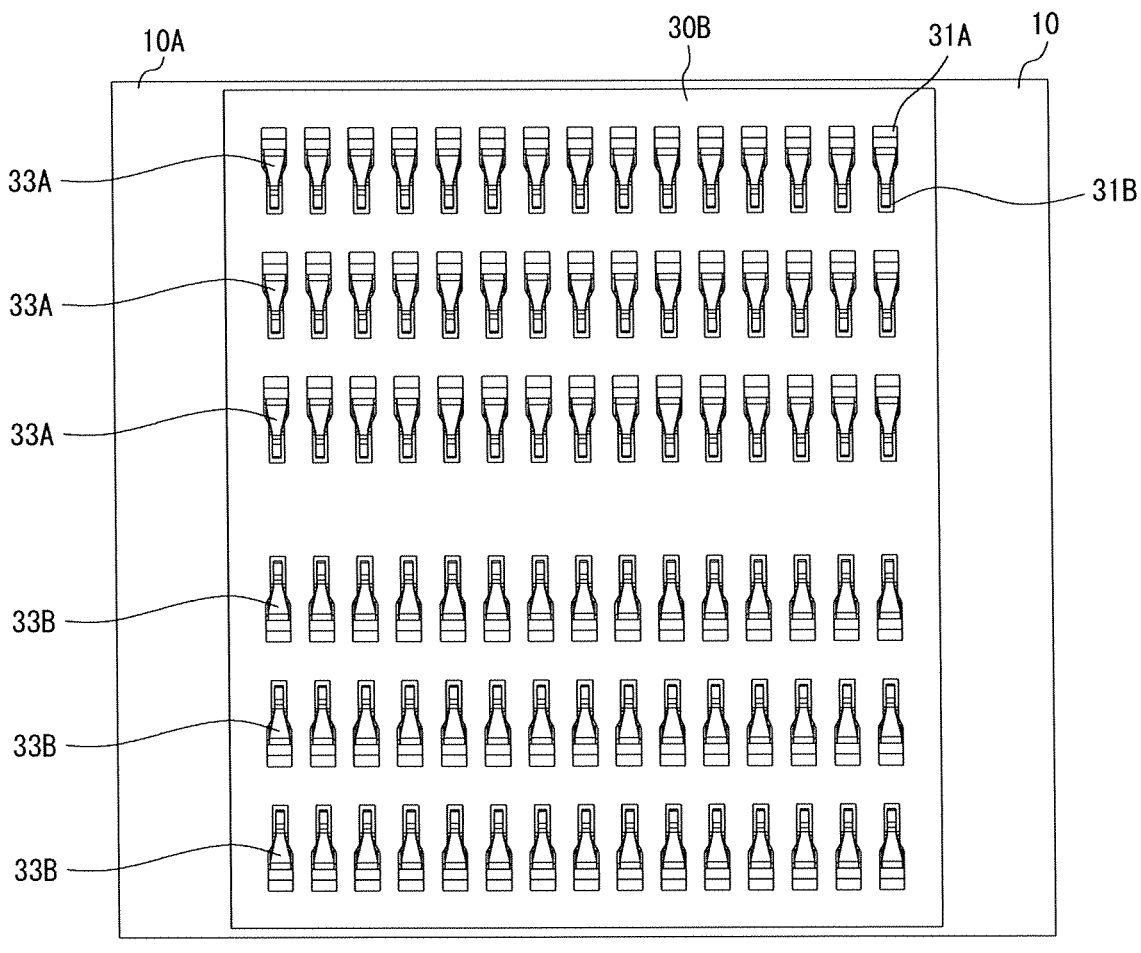
FIG. 15 is a plan view of a board-to-board connector mounted on a first board (third embodiment)
Figure 15:
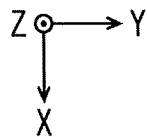
Figure 16:
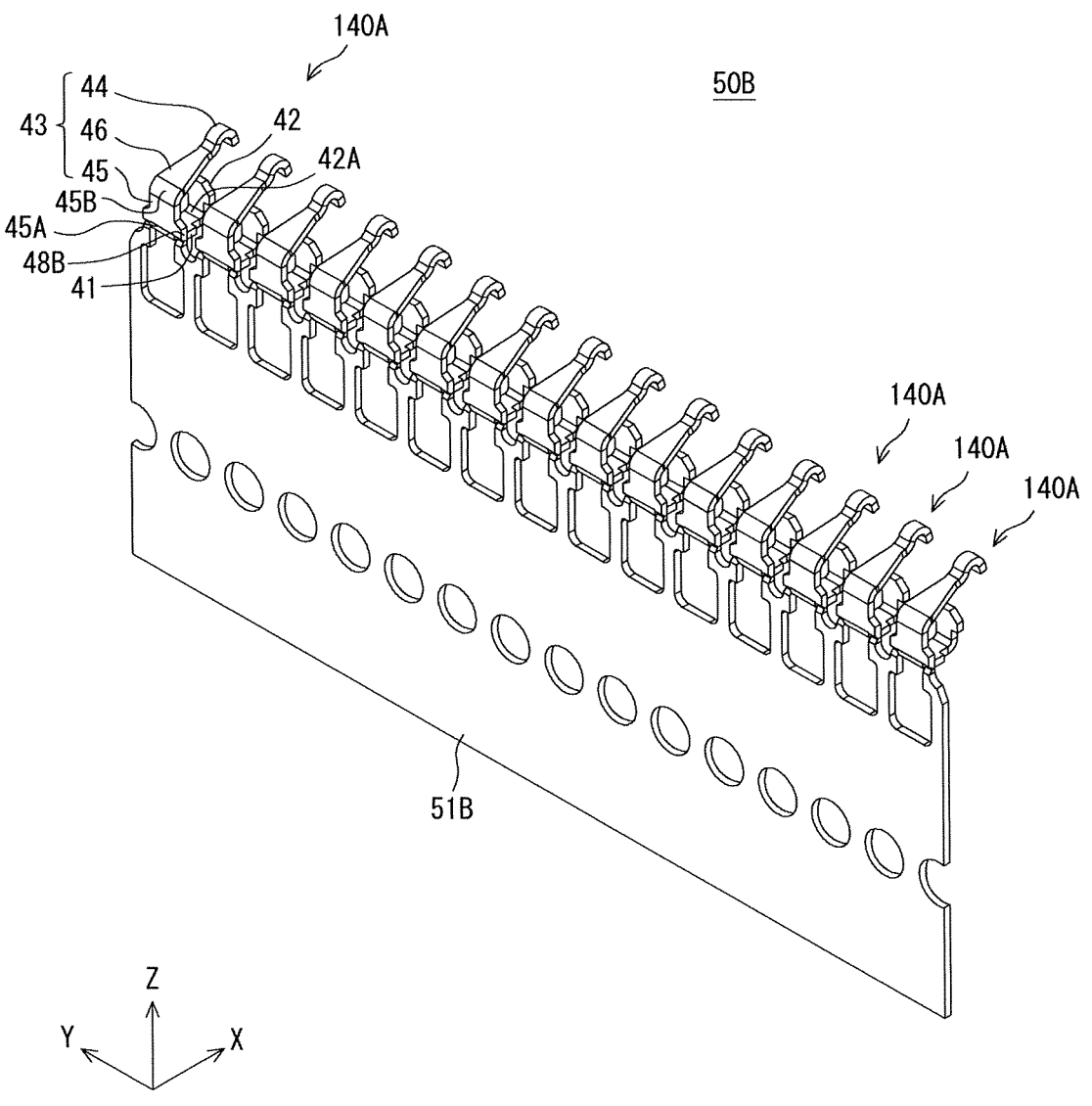
FIG. 16 is a perspective view of a contact with carrier (third embodiment)

Referring next to FIGS. 15 and 16, a third embodiment will be described. Hereinafter, differences of this embodiment from the above-described second embodiment will be mainly described, and redundant description will be omitted.

As shown in FIG. 15, in a connector 30B (a board-to-board connector), unlike the connector 30A, each of the contact holding grooves 31A does not include the concave part 31C. Each of the contact holding grooves 31A includes a concave part (not shown) that is opened on the surface of the housing 131 on the side of the input-output board 10. This concave part preferably has a structure that is similar to that of the concave part 31C with the exception of the opening parts.

<Method for Manufacturing Contacts>

Next, one example of a method for manufacturing a plurality of contacts 140A will be described. Differences from the aforementioned one example of the method for manufacturing the plurality of contacts 140 will be mainly described, and redundant description will be omitted.

As shown in FIG. 16, a contact 50B with carrier includes a carrier 51B and a plurality of contacts 140A. The contacts 140A have a structure the same as that of the contact 140 with the exception of the position of a carrier cutting surface. Each of the contacts 140A is mechanically connected to the carrier 51B via two cutting parts 48B. By setting each of the two cutting parts 48B, each of the contacts 140A is separated from the carrier 51B. Each of these separated contacts 140A has two carrier cutting surfaces 47B. The two carrier cutting surfaces 47B are formed by the two cutting parts 48B being cut. The carrier cutting surface 47B shown in FIG. 10 is formed in an end part of the spring part 43 on the side of the CPU board 20. The spring part 43 of each of the contacts 140A includes two carrier cutting surfaces 47B. The two carrier cutting surfaces 47B are disposed in an end part of the spring part 43 on the side of the CPU board 20 in the pitch direction (in this example, Y-axis direction) with gaps therebetween. The two carrier cutting surfaces 47B face toward the input-output board 10. The two carrier cutting surfaces 47B is observable from the input-output board 10. Specifically, the two carrier cutting surfaces 47B is observable from the front of the two carrier cutting surfaces 47B (in this example, negative Z-axis direction) or from an oblique direction of the two carrier cutting surfaces 47B on the side of the input-output board 10 from the carrier cutting surface 47B. The oblique direction of the two carrier cutting surfaces 47B is, for example, a direction along a virtual line that crosses one normal line of the two carrier cutting surfaces 47B.

The cutting parts 48B may be cut by pressing the contact 50B with carrier from the side of the input-output board 10 of the housing 131 and press-fitting the holding parts 42 of the respective contacts 140A of the contact 50B with carrier into the respective contact holding grooves 31A. Further, the cutting parts 48B may be cut while performing this press fitting. The carrier 51B may be swung around the cutting parts 48B, thereby cutting the cutting parts 48B. As described above, since each of the contact holding grooves 31A includes a concave part (not shown), the carrier 51B can be swung easily around the cutting parts 48B. This allows the housing 131 to easily hold the plurality of contact rows 32.

Fourth Embodiment

Figure 17:
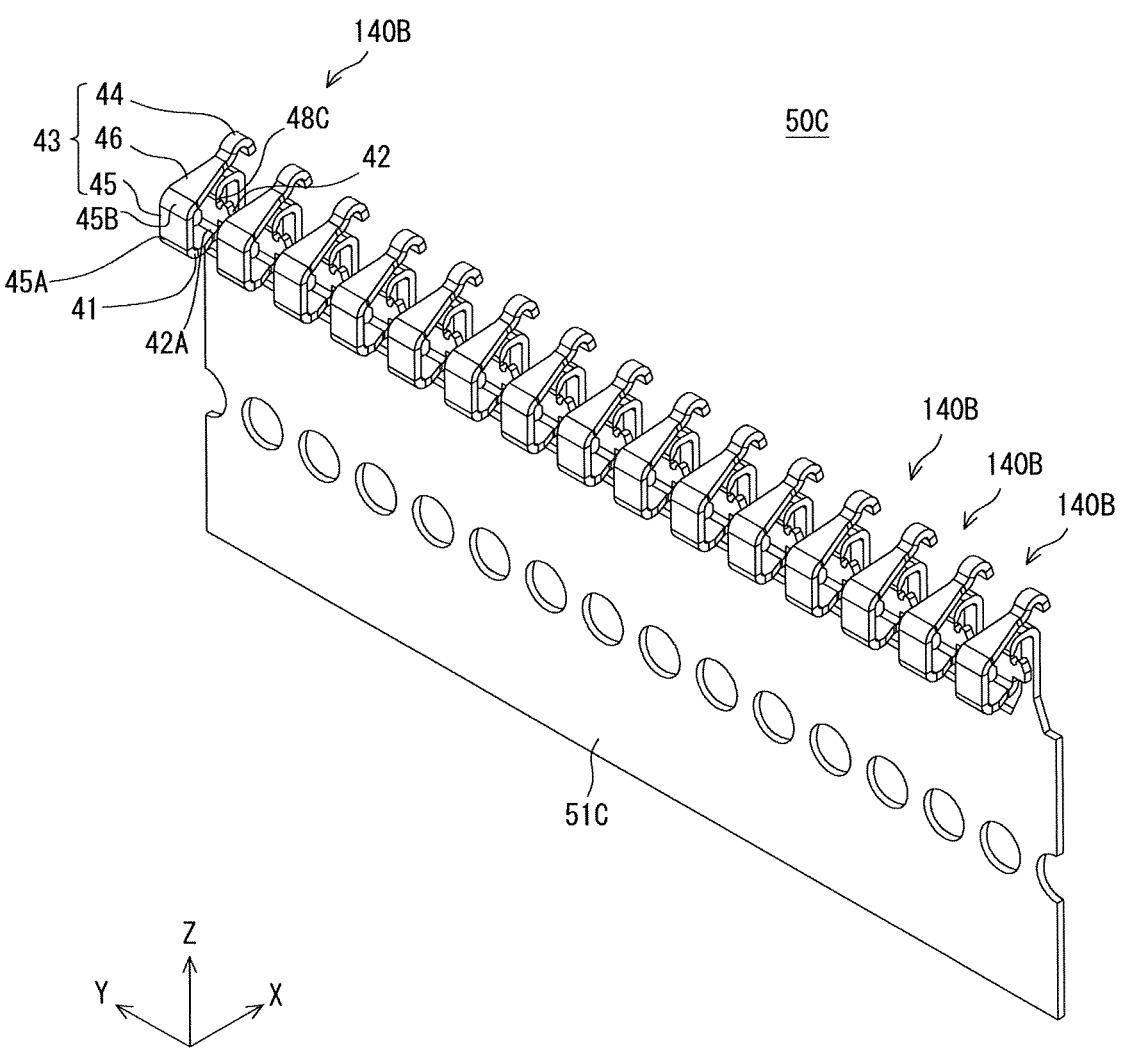
FIG. 17 is a perspective view of a contact with carrier (fourth embodiment)

Referring next to FIG. 17, a fourth embodiment will be described. Hereinafter, differences of this embodiment from the above-described third embodiment will be mainly described, and redundant description will be omitted.
<Method for Manufacturing Contacts>

One example of a method for manufacturing a plurality of contacts 140B will be described. Hereinafter, differences from the aforementioned example of manufacturing a plurality of contacts 140A will be mainly described, and redundant description will be omitted.

As shown in FIG. 17, a contact 50C with carrier includes a carrier 51C and a plurality of contacts 140B. The respective contacts 140B are mechanically connected to the carrier 51C via respective cutting parts 48C. By cutting the cutting parts 48C, the plurality of contacts 140B are separated from the carrier 51C. Each of these separated contacts 140B includes one carrier cutting surface 47C. The carrier cutting surface 47C is formed by the cutting parts 48C being cut. The carrier cutting surface 47C shown in FIG. 10 is formed in an end part of the holding part 42 on the side of the CPU board 20. That is, the carrier cutting surface 47C shown in FIG. 13 is formed in an end part of the spring part 43 on the side of the CPU board 20. The holding part 42 of each of the contacts 140B has one carrier cutting surface 47C. The one carrier cutting surface 47C overlaps the extended part 46 when it is seen from the CPU board 20. Accordingly, it is possible to reduce the distance between the plurality of contacts 140B in the contact 50C with carrier. The carrier cutting surface 47C faces toward the CPU board 20.

Like in the contact 50B with carrier, in the contact 50C with carrier as well, the holding parts 42 may be press-fit into the respective contact holding grooves 31A, thereby cutting the cutting parts 48C. Further, the cutting parts 48C may be cut while performing this press fitting. The carrier 51B may be swung around the cutting parts 48C, thereby cutting the cutting parts 48C. As described above, since each of the contact holding grooves 31A includes a concave part (not shown), the carrier 51B can be swung easily around the cutting parts 48C. This allows the housing 131 to easily hold the plurality of contact rows 32.

Fifth Embodiment

Figure 18:
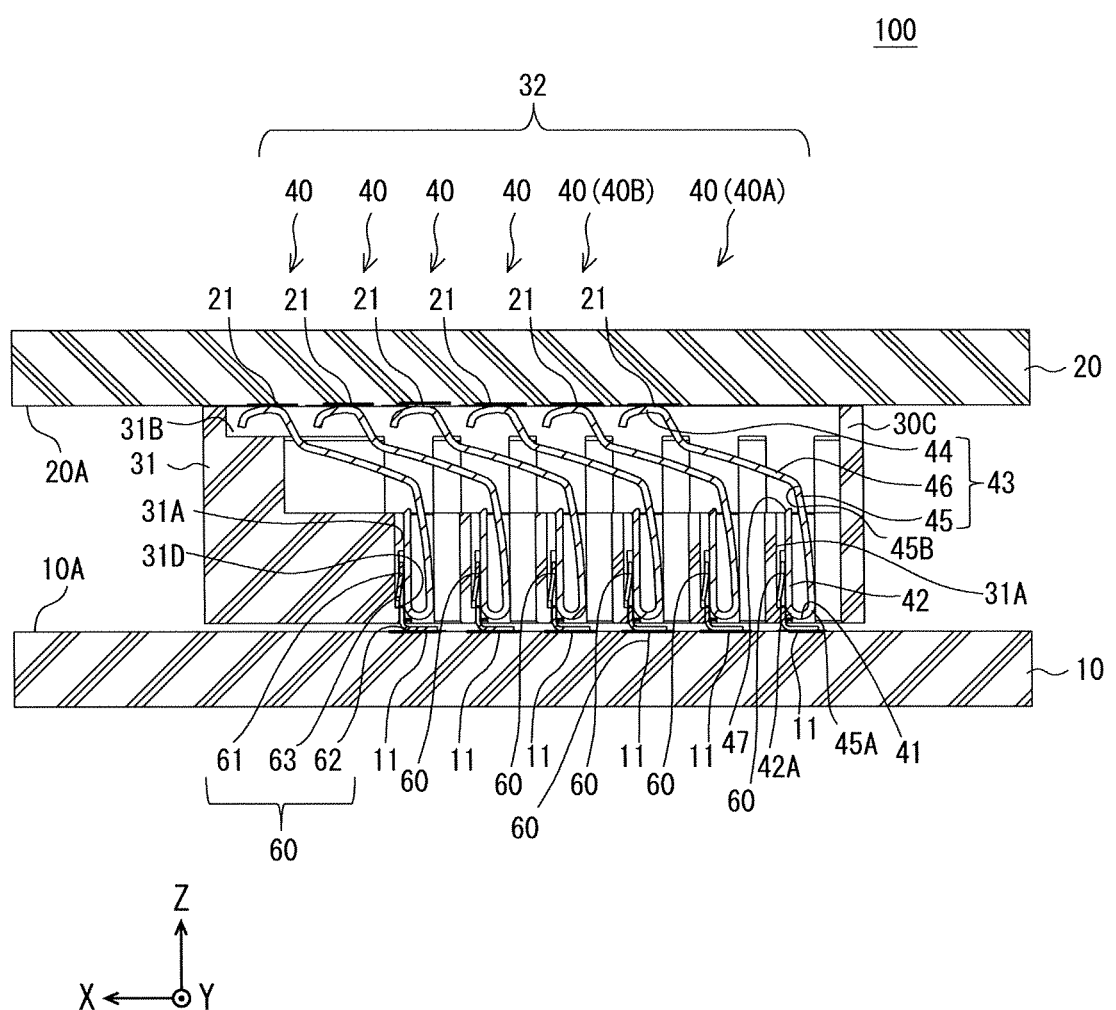
FIG. 18 is a cross-sectional view of a board-to-board connector that electrically connects a first board to a second board (fifth embodiment)
Figure 19:
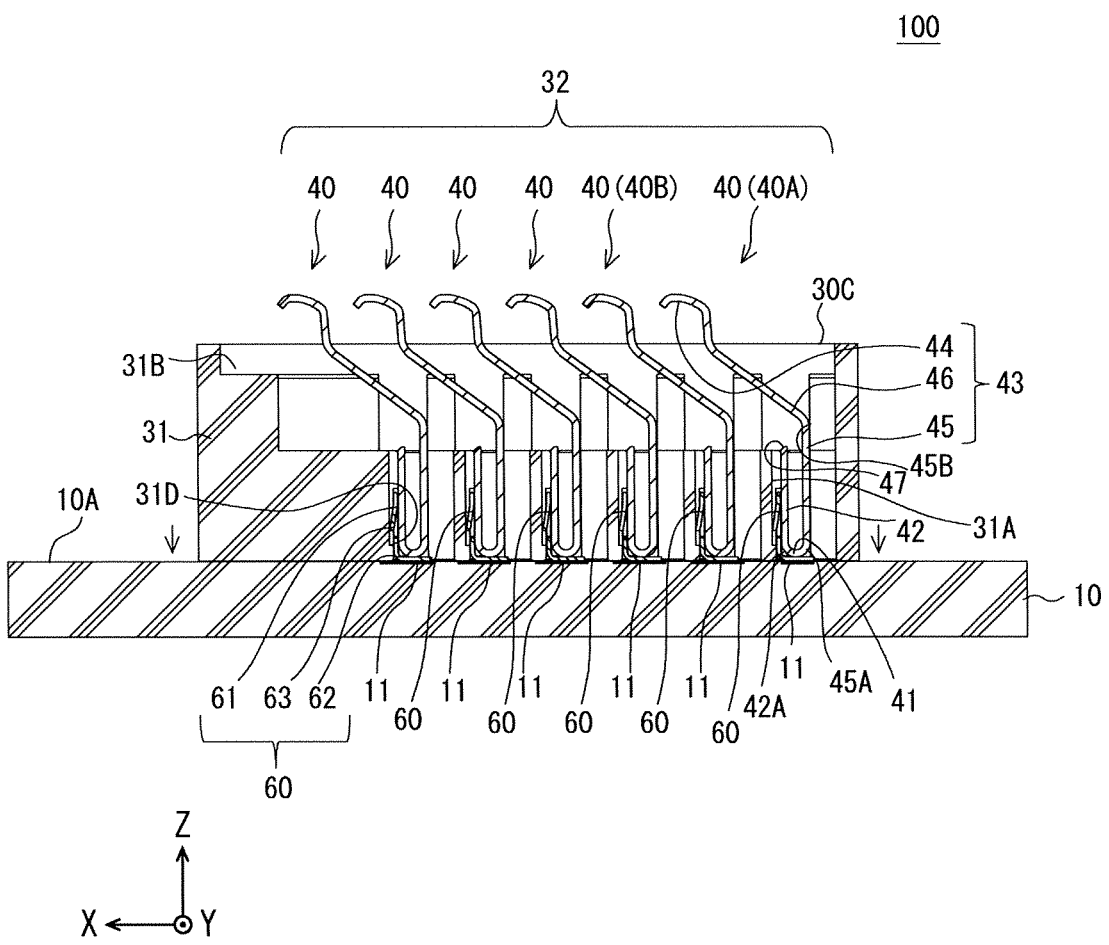
FIG. 19 is a cross-sectional view of the board-to-board connector electrically connected to the first board, a floating contact being moved to a positive Z-axis direction (fifth embodiment)
Figure 20:
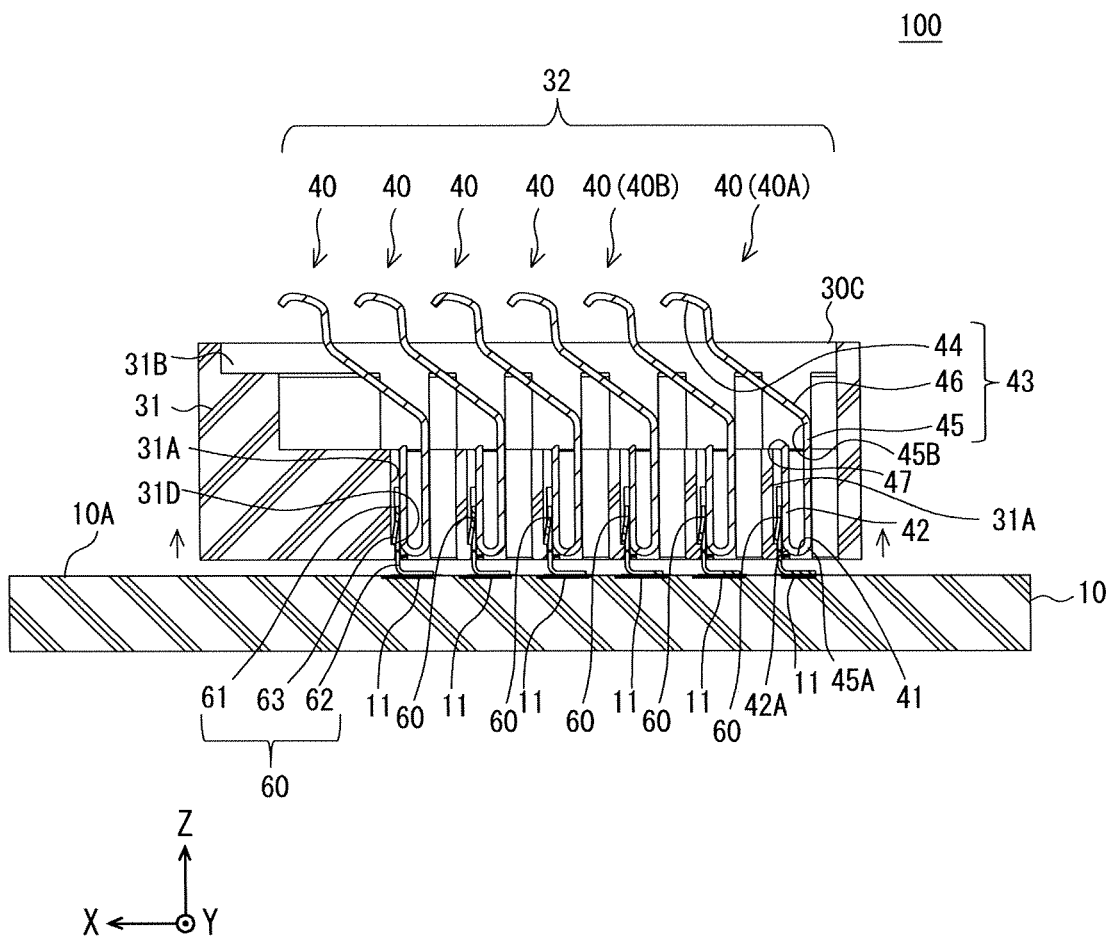
FIG. 20 is a cross-sectional view of the board-to-board connector electrically connected to the first board, a floating contact being moved to a negative Z-axis direction (fifth embodiment)
Figure 21:
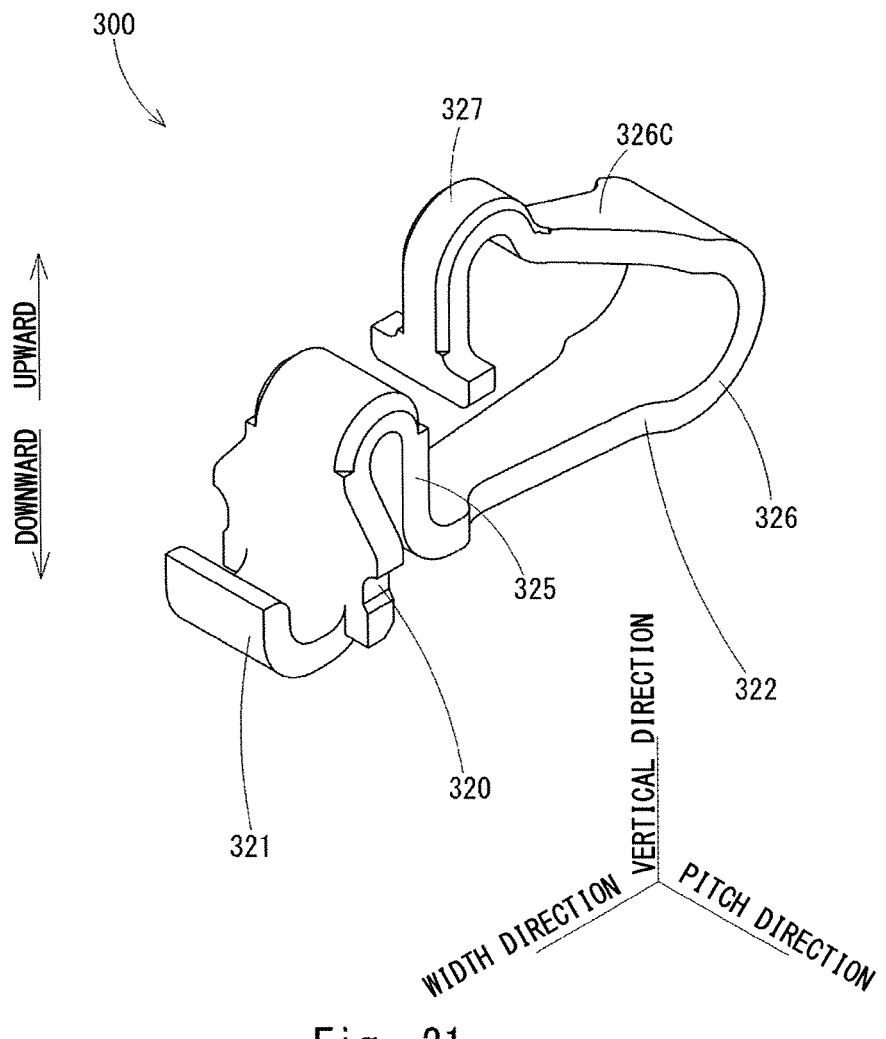
FIG. 21 is a diagram showing FIG. 13 of Patent Literature 1.

Referring next to FIGS. 18 to 20, a fifth embodiment will be described. Hereinafter, differences of this embodiment from the above-described first embodiment will be mainly described, and redundant description will be omitted.

As shown in FIG. 18, a connector 30C (board-to-board connector) includes floating contacts 60. The floating contacts 60 are, for example, plate-shaped contacts that are extended to form a right angle in the cross section shown in FIG. 18 (in this example, ZX-plane). The floating contacts 60 each include a carrying part 61, a terminal part 62, and a protrusion part 63. The carrying part 61 is interposed between the holding part 42 and the contact holding groove 31A, and thereby the carrying part 61 is carried in such a way that it is movable along the contact holding groove 31A. For example, the floating contact 60 can move along the contact holding groove 31A toward the input-output board 10 under the weight of the floating contact 60. The terminal part 62 of the floating contact 60 is protruded from a bottom surface of the housing 31 and can be electrically connected to the pad 11 of the input-output board 10. The bottom surface of the housing 31 is a surface of the housing 31 on the side of the input-output board 10. The floating contact 60 is electrically connected to the holding part 42. In this state, the terminal parts 62 and the pads 11 may be electrically connected to each other by soldering. In this case, solder flows into the upper surfaces of the respective terminal parts 62, which causes the terminal parts 62 and the corresponding connecting parts 41 to be soldered together. Note that the upper surface of the terminal part 62 is the surface of the terminal part 62 on the side of the CPU board 20. Further, the contact holding groove 31A of the housing 31 includes a step part 31D that is protruded in the X-axis negative direction. The protrusion part 63 of the floating contact 60 is protruded from the carrying part 61 toward the contact holding groove 31A. The step part 31D is disposed in the contact holding groove 31A on the side of the input-output board 10. When the floating contacts 60 continue to move in the negative Z-axis direction, the protrusion parts 63 come into contact with the respective step parts 31D and the movement of the floating contacts 60 in the negative Z-axis direction is stopped.

FIG. 19 shows a state in which the connector 30C is mounted on the input-output board 10 when a board such as the input-output board 10 and the connector 30C both have good planarity or flatness, that is, a board such as the input-output board 10 and the connector 30C have little warping, curling, distortion, etc. At this time, the bottom surface of the housing 31 is in a state in which it contacts the input-output board 10, the terminal parts 62 of the floating contacts 60 are in a state in which they contact the pads 11 of the input-output board 10, and the floating contacts 60 are in a state in which they move in the positive Z-axis direction.

FIG. 20 shows a state of the housing 31 that is slightly raised from the state shown in FIG. 19. At this time, the floating contacts 60 move in the negative Z-axis direction due to gravity, and the terminal parts 62 come into contact with the pads 11 of the input-output board 10. In both the state shown in FIG. 19 and the state shown in FIG. 20, the terminal parts 62 and the pads 11 may be electrically connected to each other by soldering. At this time, solder flows into the upper surfaces of the respective terminal parts 62, which causes the terminal parts 62 and the corresponding connecting parts 41 to be soldered together.

From the above discussion, the floating contacts 60 move in the board opposing direction (in this example, Z-axis direction), and can be electrically connected to the respective pads 11 of the input-output board 10. Therefore, even when the opposed surface 10A of the input-output board 10 has some irregularities or is inclined, the floating contacts 60 move in the board opposing direction and the respective contacts 40 can be electrically connected to the respective pads 11 of the input-output board 10 with a high reliability. That is, it is possible to improve the reliability of the electrical connection between the input-output board and the CPU board 20.

Note that the present disclosure is not limited to the above-described embodiments and may be changed as appropriate without departing from the spirit of the present disclosure.

The first to fifth embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A board-to-board connector that is interposed between a first board and a second board, the board-to-board connector thus electrically connecting a plurality of pads of the first board to a plurality of respective pads of the second board, the board-to-board connector comprising:

a housing; and a plurality of contacts held on the housing, wherein when a direction in which the first board and the second board are opposed to each other is called a board opposing direction, each of the contacts includes a holding part, a connecting part, and a spring part, the holding part having a longitudinal axis which is extended in the board opposing direction and is held on the housing by press fitting, the spring part includes a contact part, an extended part, and a projection part, the projection part is extended in the board opposing direction and is opposed to the holding part, the connecting part connects an end part of the projection part on the side of the first board and an end part of the holding part on the side of the first board, the connecting part further being able to come in contact with a corresponding pad of the first board, the extended part is extended from an end part of the projection part on the side of the second board in such a way that the extended part passes between the holding part and the second board on the longitudinal axis of the holding part, and the contact part is disposed in the extended part in such a way that the contact part comes into contact with a corresponding pad of the second board.

2. The board-to-board connector according to claim 1, wherein the holding part or the spring part of each of the contacts has a carrier cutting surface.

3. The board-to-board connector according to claim 2, wherein, when the holding part of each of the contacts has the carrier cutting surface, the carrier cutting surface faces toward the second board.

4. The board-to-board connector according to claim 2, wherein, when the spring part of each of the contacts has the carrier cutting surface, the carrier cutting surface faces toward the first board.

5. The board-to-board connector according to claim 3, wherein the carrier cutting surface is observable from the second board.

6. The board-to-board connector according to claim 2, wherein each of the contacts is plated with the exception of the carrier cutting surface.

7. The board-to-board connector according to claim 2, wherein each of the contacts includes a blanked-out surface, and a surface roughness of the carrier cutting surface is higher than a surface roughness of the blanked-out surface.

8. The board-to-board connector according to claim 2, wherein the carrier cutting surface faces in a direction that is opposite to a direction in which the extended part of the spring part is extended from the end part of the projection part on the side of the second board in a developed shape of each of the contacts.

9. The board-to-board connector according to claim 1, wherein the plurality of contacts include a first contact and a second contact adjacent to each other, and the extended part of the spring part of the first contact is opposed to the extended part pf the spring part of the second contact in the board opposing direction.

10. The board-to-board connector according to claim 1, wherein the connecting part includes a longitudinal axis perpendicular to the longitudinal axis of the holding part.

11. The board-to-board connector according to claim 10, wherein the projection part includes a longitudinal axis, and wherein the longitudinal axis of the projection part is parallel to the longitudinal axis of the holding part and perpendicular to the longitudinal axis of the connecting part.

12. The board-to-board connector of claim 1, wherein the end part of the holding part comprises a location of the holding part closest the first board.

13. The board-to-board connector of claim 1, wherein the holding part has a length greater than a length of the connecting part.

14. The board-to-board connector according to claim 13, wherein the spring part has a length greater than the length of the holding part.

\* \* \* \* \*